(12) United States Patent
Park

(10) Patent No.: US 7,348,254 B2
(45) Date of Patent: Mar. 25, 2008

(54) METHOD OF FABRICATING FIN FIELD-EFFECT TRANSISTORS

(75) Inventor: Jeong Ho Park, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 152 days.

(21) Appl. No.: 11/319,261

(22) Filed: Dec. 29, 2005

(65) Prior Publication Data

US 2006/0148164 A1 Jul. 6, 2006

(30) Foreign Application Priority Data

Dec. 30, 2004 (KR) ............... 10-2004-0117028

(51) Int. Cl.
*H01L 21/76* (2006.01)

(52) U.S. Cl. .............. 438/424; 438/294; 438/404; 438/443; 257/E21.545; 257/E21.546

(58) Field of Classification Search ........... 438/295, 438/405, 443; 257/E21.4, E21.615
See application file for complete search history.

(56) References Cited

U.S. PATENT DOCUMENTS

| 5,949,126 | A * | 9/1999 | Dawson et al. ............. 257/513 |
| 7,176,530 | B1 * | 2/2007 | Bulucea et al. ............ 257/369 |
| 2005/0167778 | A1 * | 8/2005 | Kim et al. .................. 257/510 |

* cited by examiner

*Primary Examiner*—Michael Lebentritt
*Assistant Examiner*—Cheung Lee
(74) *Attorney, Agent, or Firm*—McKenna Long & Aldridge LLP

(57) ABSTRACT

A method of fabricating a fin field-effect transistor that may enable a reduction in the number of process steps, by forming the fin structure by etching away a predetermined thickness of an element isolation layer. The method includes steps of sequentially forming a first insulating layer and a second insulating layer on a region of a substrate excluding an inactive region thereof; forming a trench of the inactive region of the substrate by using the first and second insulating layers as a mask; forming an element isolation layer in the trench; and removing the first insulating layer and the second insulating layer and, at the same time, removing a predetermined thickness of the element isolation layer.

14 Claims, 11 Drawing Sheets

METHOD OF FABRICATING FIN FIELD-EFFECT TRANSISTORS

CROSS REFERENCE TO RELATED APPLICATIONS

This application claims the benefit of Korean Patent Application No. 10-2004-0117028, filed on Dec. 30, 2004, which is hereby incorporated by reference as if fully set forth herein.

BACKGROUND OF THE INVENTION

1. Field of the Invention

The present invention relates to semiconductor devices, and more particularly, to a method of fabricating a fin field-effect transistor, which reduces the number of process steps by forming the fin structure by etching away a predetermined thickness of an element isolation layer.

2. Discussion of the Related Art

A MOS field-effect transistor that is mainly used for a memory semiconductor device, such as a conventional DRAM device, is a substantially planar transistor where a gate insulating layer covers a surface of a silicon substrate and a conductive layer is formed on the gate insulating layer. With increased integration, however, the line width of a gate pattern and the length and width of a channel are reduced, deteriorating transistor operation by, for example, increasing short-channel and narrow-channel effects. Along with the higher integration, a driving current flowing through a substrate channel, underlying the gate electrode in each cell, may flow through a greatly limited depth and width of the channel adjacent to the gate electrode. However, limiting the current levels degrades transistor characteristics.

To overcome short-channel effects and the driving current limitation, the MOS field-effect transistor may be provided with a fin structure to enlarge a contact surface area existing between the substrate and the gate electrode in a shallow junction structure, and thus enable increased levels in the driving current. A contemporary fin field-effect transistor, known as a "finFET," is shown in FIGS. 1A-1M.

As shown in FIG. 1A, after respectively depositing layers of oxide and nitride on the entire surface of a semiconductor substrate 100 having separately defined active and inactive regions (not shown), each deposited layer is patterned by photolithography and etching processes to form a pad oxide layer 154 and a pad nitride layer 155 in the inactive region. The active region of the semiconductor substrate 100 is thus exposed by a trench 191 formed by etching.

As shown in FIG. 1B, a fin 101 is formed in the trench 191.

As shown in FIG. 1C, the pad oxide layer 154 and the pad nitride layer 155 are removed to form trenches 192 in the inactive regions of the semiconductor substrate 100.

As shown in FIG. 1D, ions are implanted in the fin 101, disposed on the active regions of the semiconductor substrate 100, to form a well region (not shown).

As shown in FIG. 1E, a gate oxide layer 102 is formed by performing a thermal oxidation process or a rapid thermal process with respect to the entire surface of semiconductor substrate 100 on which the fin 101 and well region are formed. Subsequently, a gate electrode polysilicon layer 103 is formed on the entire surface of the semiconductor substrate 100 where the gate oxide layer 102 is formed.

As shown in FIG. 1F, the gate electrode polysilicon layer 103 and gate oxide layer 102 are patterned by photolithography and etching processes to form a gate electrode 149.

As shown in FIG. 1G, a low-concentration ion implantation process for forming a shallow junction region is performed to form a lightly doped junction region 105a (P− or N−) in the fin 101 of the active region.

As shown in FIG. 1H, predetermined deposition and etching processes are formed, to form a spacer 106 on the sidewall of the gate electrode 149.

As shown in FIG. 1I, a high-concentration implantation process is performed to form a heavily doped junction region 105b (P+ or N+) in the fin 101, thereby forming a source/drain region 105 including the lightly doped junction region 105a and the heavily doped junction region 105b. Next, the gate electrode 149 is doped using a low-on concentration ion implantation process.

As shown in FIG. 1J, a photoresist pattern 188 is formed to expose the inactive regions of the semiconductor substrate 100.

As shown in FIG. 1K, using the photoresist pattern 188 as a mask, the inactive regions of the semiconductor substrate 100 are etched to form trenches 193.

As shown in FIG. 1L, the trench 193 is filled with an insulating layer to form an element isolation layer 107.

As shown in FIG. 1M, the photoresist pattern 188 is removed.

The method of fabricating such a fin field-effect transistor has a large number of process steps, which employ numerous masks, which lowers the yield of the product.

SUMMARY OF THE INVENTION

Accordingly, the present invention is directed to a method of fabricating a fin field-effect transistor that substantially obviates one or more problems due to limitations and disadvantages of the related art.

An advantage of the present invention is that it can provide a method of fabricating a fin field-effect transistor which enables a reduction in the number of process steps by forming the fin structure by etching away a predetermined thickness of an element isolation layer.

Additional advantages, and features of the invention will be set forth in part in the description which follows, and in part will become apparent from the description, or may be learned by practice of the invention. The objectives and other advantages of the invention may be realized and attained by the structure particularly pointed out in the written description and claims hereof as well as the appended drawings.

To achieve these and other advantages in accordance with the purpose of the invention, as embodied and broadly described herein, a method of fabricating a fin field-effect transistor comprises sequentially forming a first insulating layer and a second insulating layer on an active region of a substrate, forming a trench in an inactive region of the substrate by using the first and second insulating layers as a mask, forming an element isolation layer in the trench, and removing the first insulating layer and the second insulating layer and, at the same time, removing a predetermined thickness of the element isolation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention.

In the drawings.

DETAILED DESCRIPTION OF THE ILLUSTRATED EMBODIMENTS

Reference will now be made in detail to exemplary embodiments of the present invention, examples of which are illustrated in the accompanying drawings. Wherever possible, like reference designations will be used throughout the drawings to refer to the same or similar parts.

FIGS. 2A-2K show a method of fabricating the fin field-effect transistor according to an embodiment of the present invention.

Figure 1A:
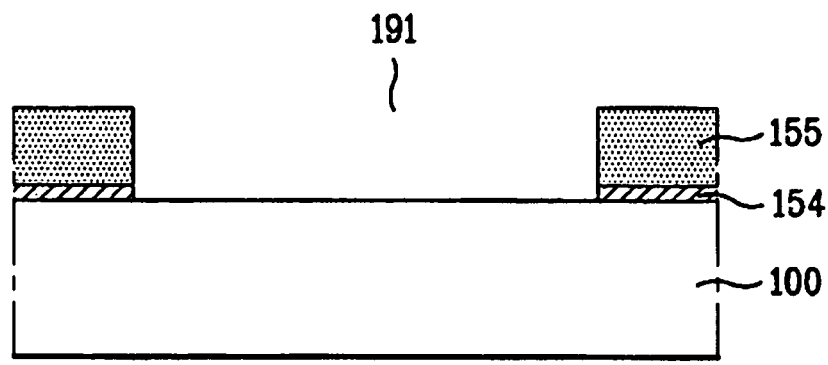
FIGS. 1A-1M are cross-sectional views of a contemporary fin field-effect transistor, respectively illustrating steps of a method according to the prior art.
Figure 1B:
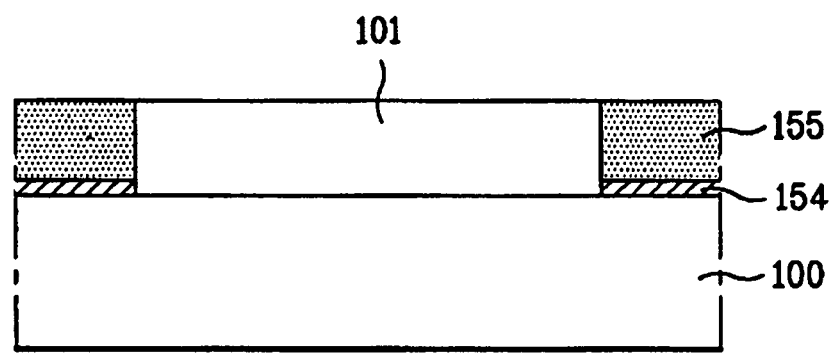
Figure 1C:
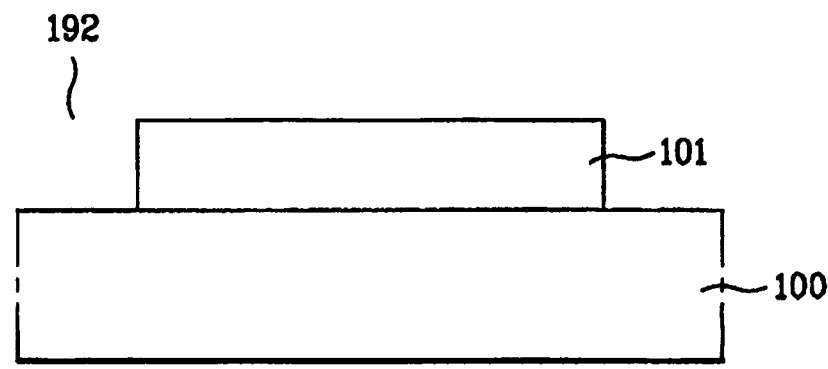
Figure 1D:
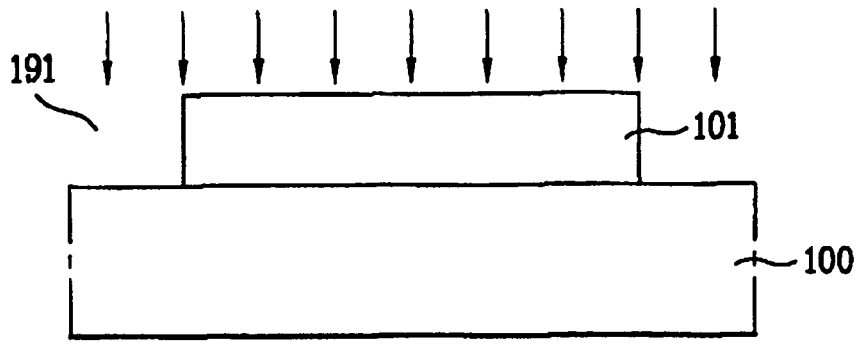
Figure 1E:
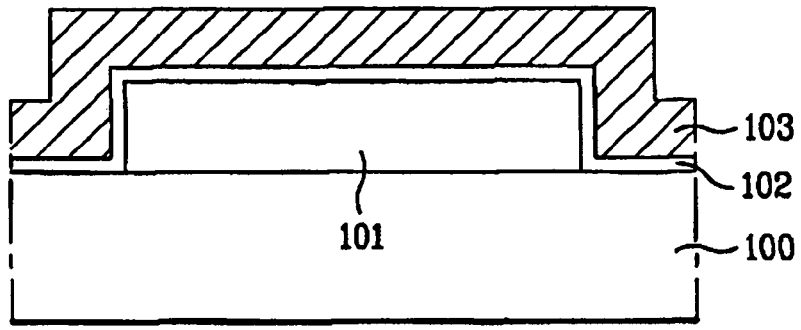
Figure 1F:
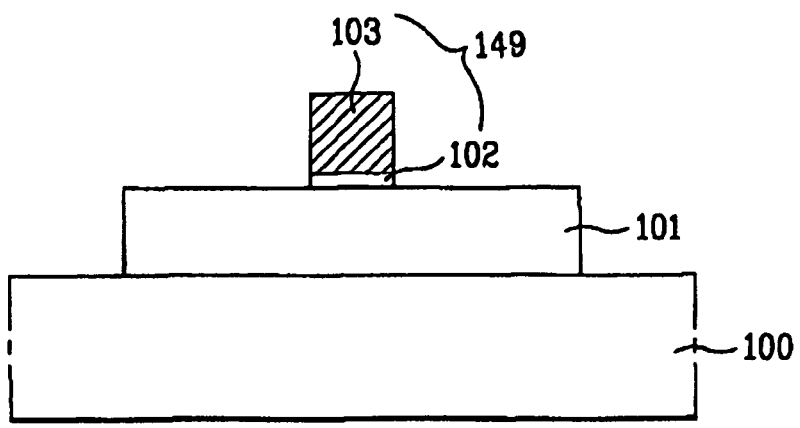
Figure 1G:
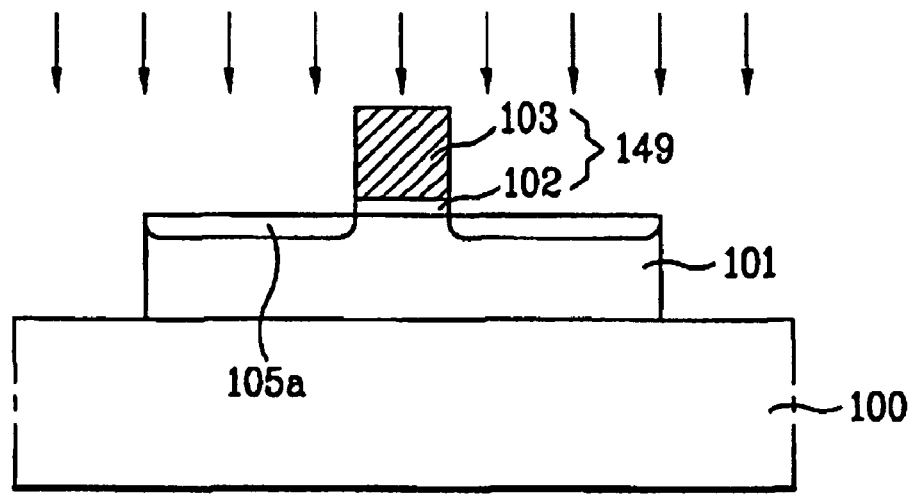
Figure 1H:
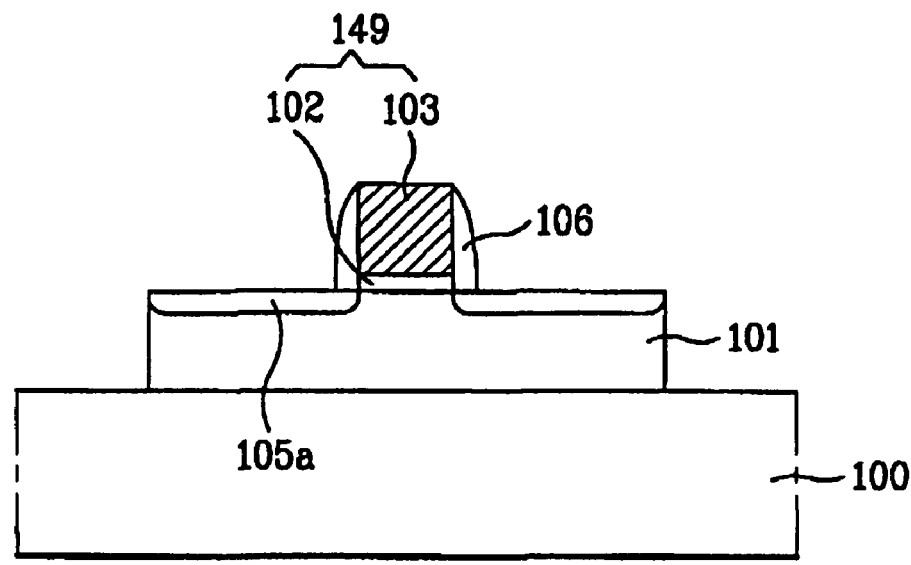
Figure 1I:
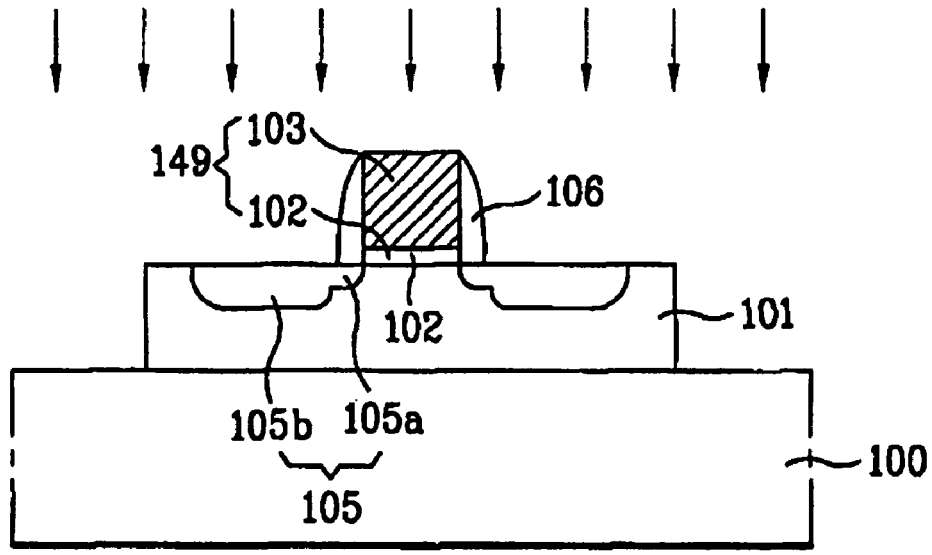
Figure 1J:
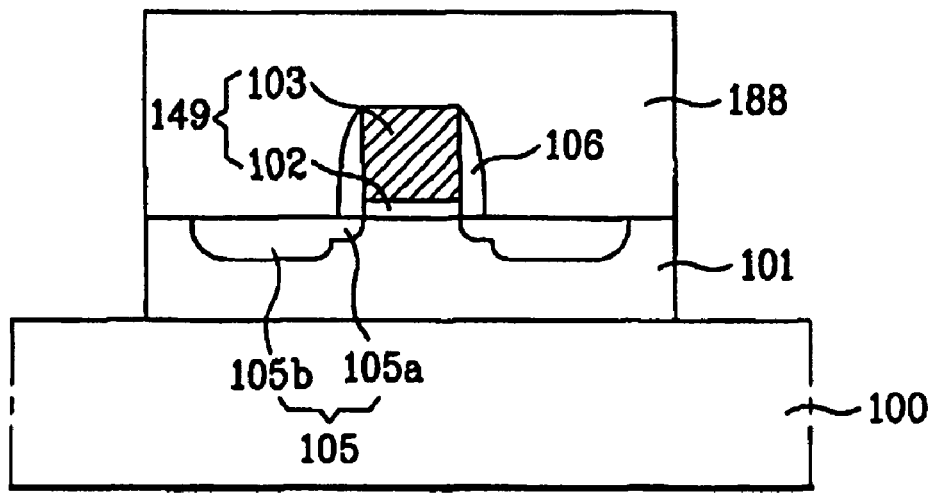
Figure 1K:
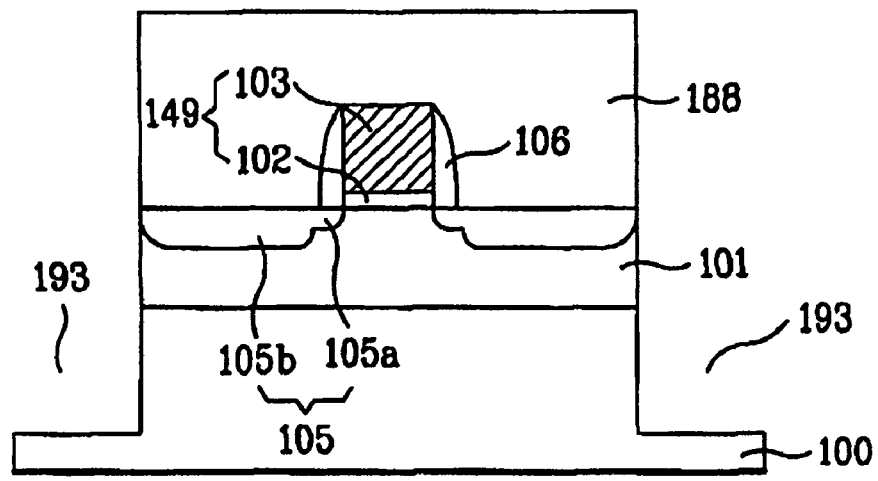
Figure 1L:
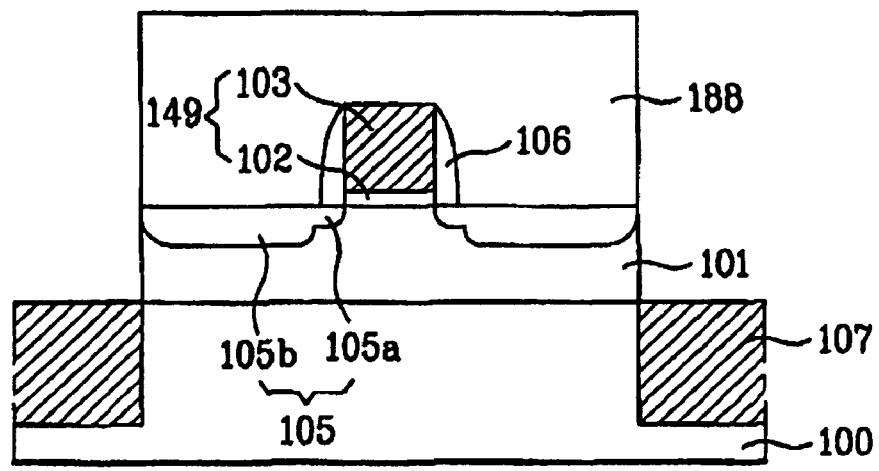
Figure 1M:
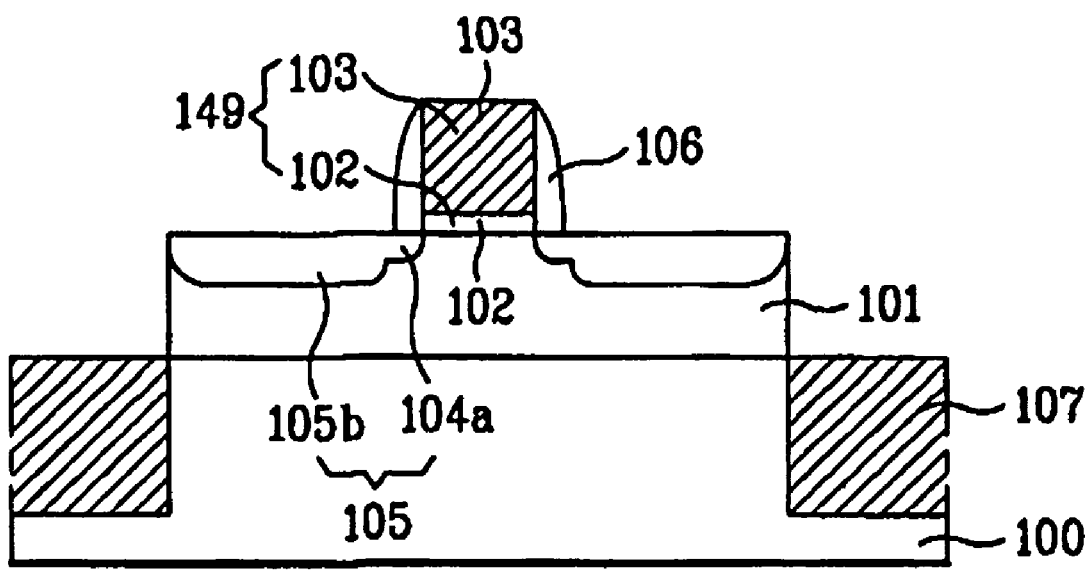
Figure 2A:
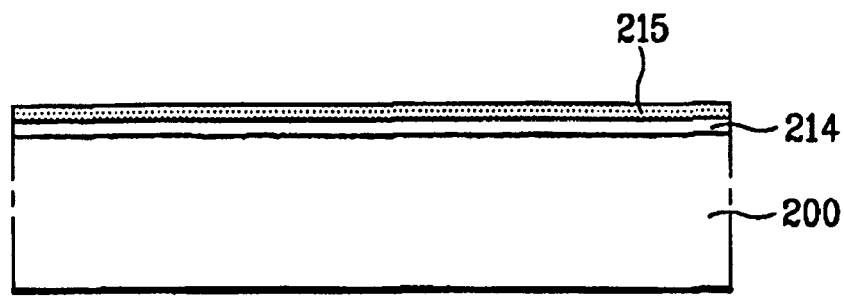
FIGS. 2A-2L are cross-sectional views of a fin field-effect transistor, respectively illustrating steps of a method according to an exemplary embodiment of the present invention.

As shown in FIG. 2A, a pad oxide layer 214 and a pad nitride layer 215 are sequentially formed on the entire surface of a semiconductor substrate 200 having separately defined active and inactive regions (not shown).

Figure 2B:
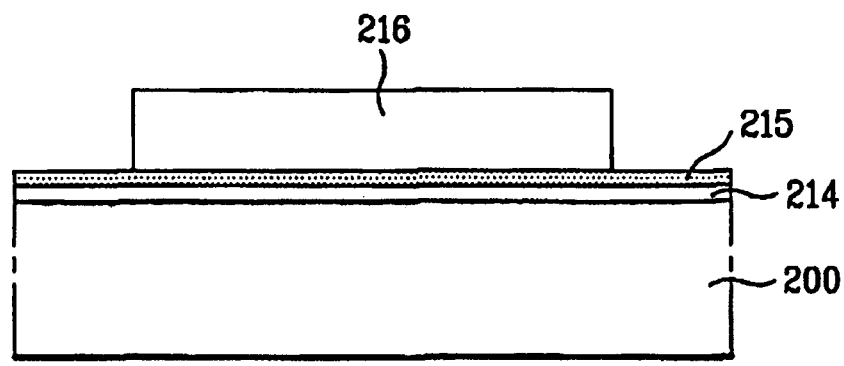

As shown in FIG. 2B, the entire surface of the semiconductor substrate 200 on which the pad oxide layer 214 and pad nitride layer 215 are formed is coated with photoresist, which undergoes exposure and developing processes to form a photoresist pattern 216. The photoresist pattern 216 exposes the inactive region of the semiconductor substrate 200. The photoresist pattern 216 is used as a mask to pattern the pad oxide layer 214 and pad nitride layer 215.

Figure 2C:
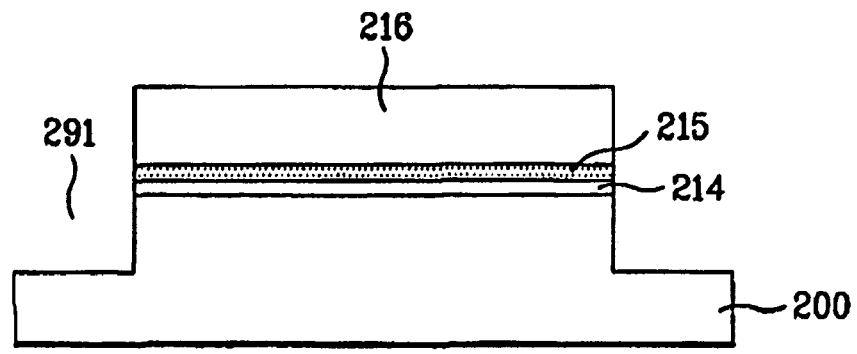

As shown in FIG. 2C, a trench 291 is formed in the inactive region of the semiconductor substrate 200 using the photoresist pattern 216, pad oxide layer 214, and pad nitride layer 215 as masks. The photoresist pattern 216 is then removed, and a rinsing process is performed to remove remaining materials from the semiconductor substrate 200. The rinsing process uses a sequence of solutions, namely, each of $H_2SO_4$, $NH_4OH$, and HF or each of $H_2SO_4$, $H_2O_2$, $NH_4OH$, HF, and buffered oxide etch (BOE).

Figure 2D:
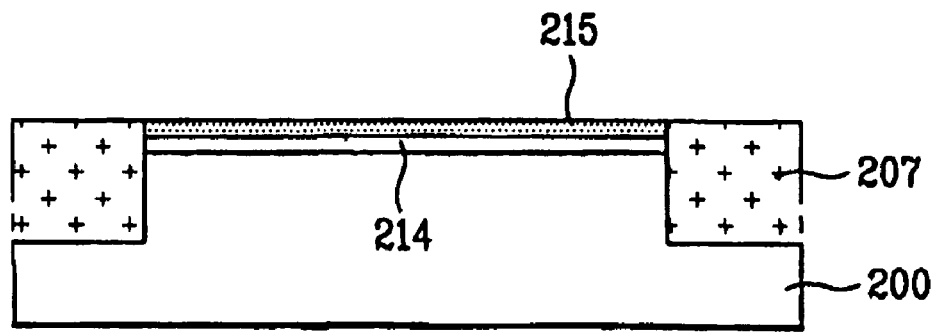

As shown in FIG. 2D, a layer of insulating material is formed on the entire surface of the semiconductor substrate 200 where the trench 291 is formed. The insulating layer is planarized by chemical-mechanical polishing until the pad nitride layer 215 is exposed, thereby forming an element isolation layer 207 constructed of the insulating material filling the trench 291.

Figure 2E:
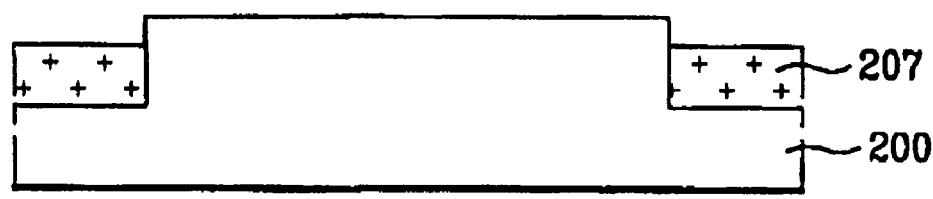

As shown in FIG. 2E, the pad oxide layer 214 and the pad nitride layer 215 are etched away while removing at least a corresponding thickness of the element isolation layer 207. This etching procedure may include a two step wet etching process wherein during the first step the pad nitride layer 215 is removed, by for example using $H_3PO_4$, and then, during the second step, the pad oxide layer 214 and a portion of the element isolation layer 207 may be simultaneously removed. Additionally, by forming the isolation layer 207 of a material that has a higher etch rate selectivity than that of the oxide of the pad oxide layer 214 with respect to the etchant used, it may be possible to remove more of the element isolation layer 207 than the thickness of the corresponding pad oxide layer 214 during the second etch step. In this manner, a predetermined thickness of the element isolation layer 207, larger than the sum of the respective thicknesses of the pad oxide layer 214 and the pad nitride layer 215, is ultimately removed by etching the surfaces of the element isolation layer 207 and of the pad oxide layer 214 and pad nitride layer 215. Therefore, the element isolation layer 207 has an upper surface at a level lower than that of the semiconductor substrate 200, to obtain a fin structure where an active region of the semiconductor substrate 200 protrudes upwardly higher than the element isolation layer 207.

Figure 2F:
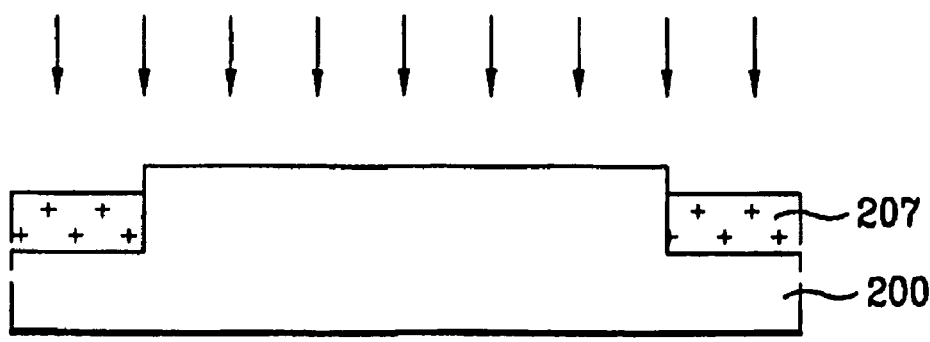

As shown in FIG. 2F, ions are implanted in the active region of the semiconductor substrate 200 to form a well region (not shown).

Figure 2G:
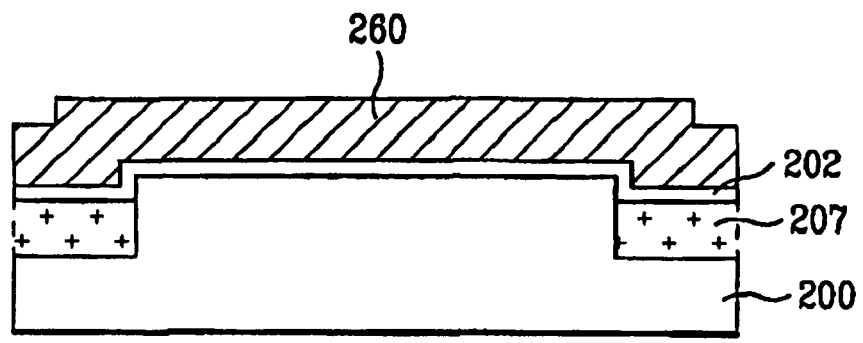

As shown in FIG. 2G, a gate oxide layer 202 is formed, by thermal oxidation process or a rapid thermal process, on the entire surface of semiconductor substrate 200 on which the fin structure and well region are formed. Subsequently, a gate electrode polysilicon layer 260 is formed on the entire surface of the semiconductor substrate 200 where the gate oxide layer 202 is formed.

Figure 2H:
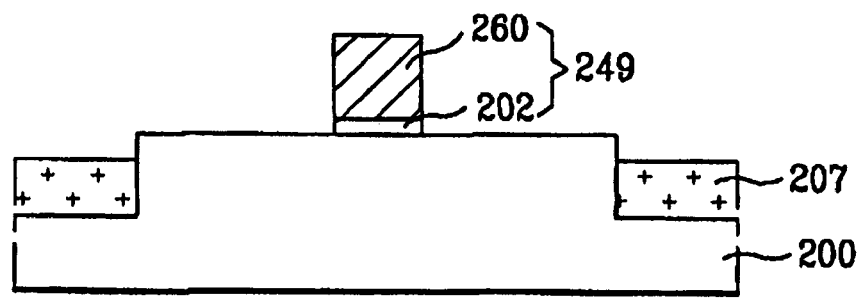

As shown in FIG. 2H, gate oxide layer 202 and gate electrode polysilicon layer 260 are patterned by photolithography to form gate electrode 249.

Figure 2I:
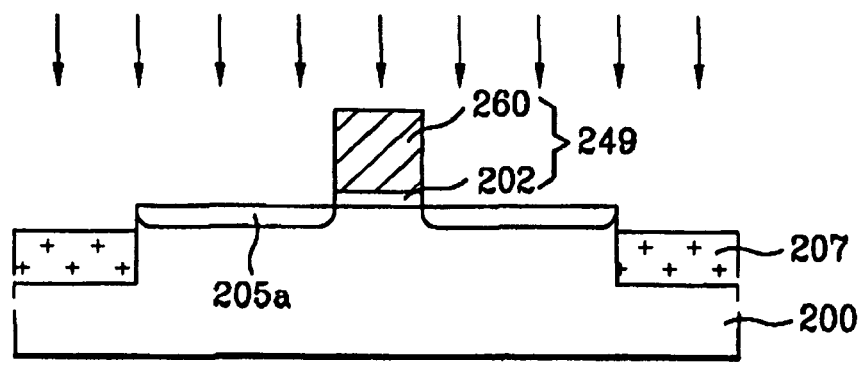

As shown in FIG. 2I, a low-concentration ion implantation process for forming a shallow junction region is performed in the active region of the semiconductor substrate 200 where the gate electrode 249 is located to form a lightly doped junction region 205a (P– or N–) in the fin structure of the active region.

Figure 2J:
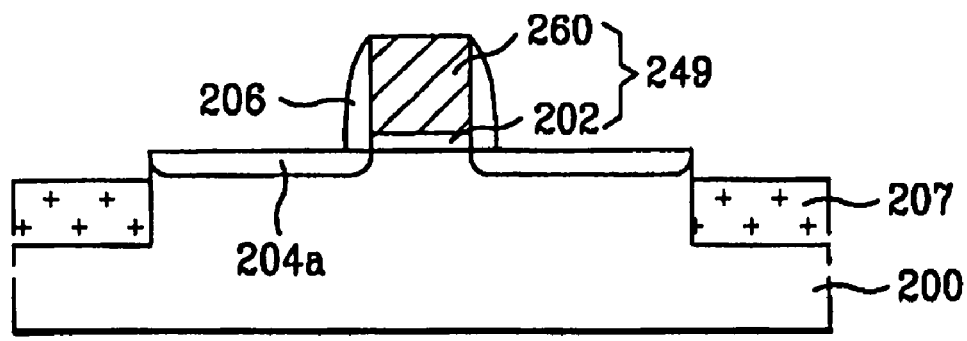

As shown in FIG. 2J, predetermined depositing and etching processes are sequentially performed to form a spacer 206 on the sidewall of the gate electrode 249.

Figure 2K:
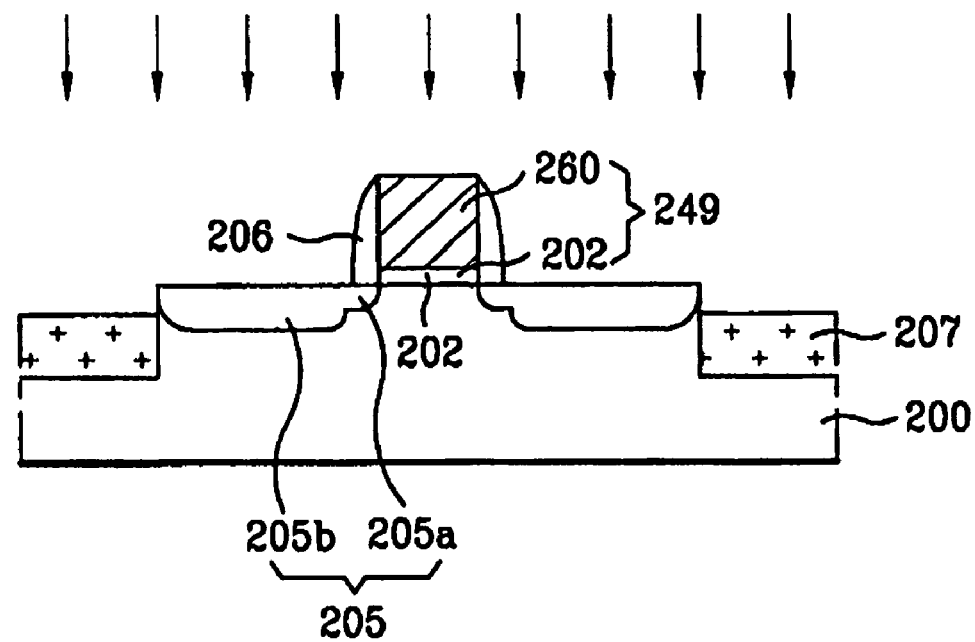

As shown in FIG. 2K, a high-concentration implantation process is performed to form a heavily doped junction region 205b (P+ or N+) in the fin structure, using spacer 206 as a mask thereby forming a source/drain region 205 including the lightly doped junction region 205a and the heavily doped junction region 205b. In one exemplary embodiment of the present invention, the heavily doped junction region 205b is formed to extend to a depth that extends below the top surface of the element isolation layer 207. In an exemplary embodiment the heavily doped junction may extend a distance of at least 500 angstroms below the top surface of the element isolation layer 207.

Figure 2L:
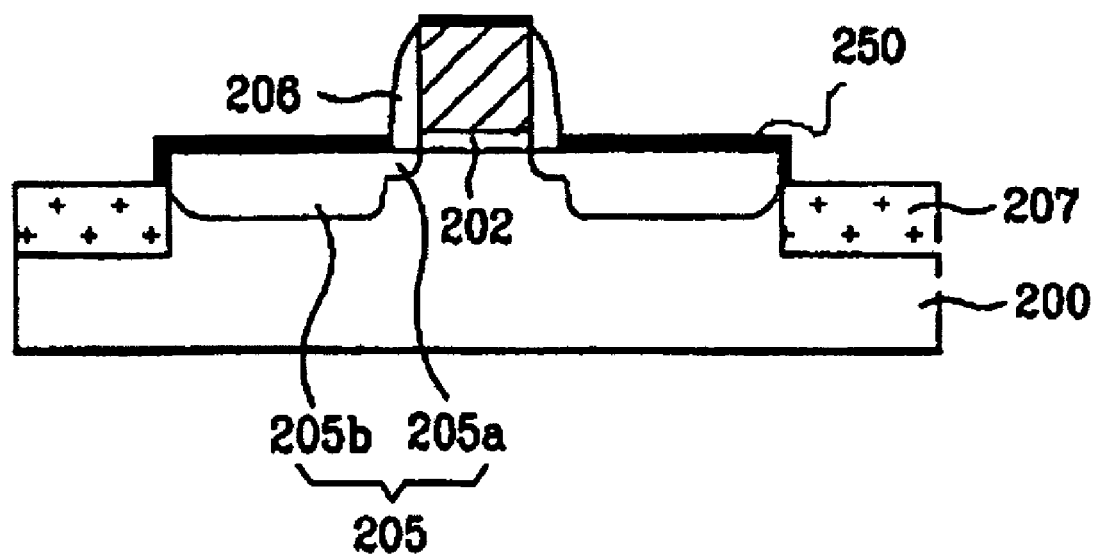

As shown in FIG. 2L, in an exemplary embodiment of the present invention, after the formation of the heavily doped junction a silicide 250 may be deposited over the junction regions and the gate. In an embodiment of the present invention the silicide deposited over the junction regions extends from spacer 206 to the element isolation layer 207, i.e. wrapping around the corner at the junction. The silicide may be formed by depositing a metal layer and then performing a heat treatment step.

According to an embodiment of the present invention, a predetermined thickness an element isolation layer is etched so that a semiconductor substrate protrudes upwardly higher than the element isolation layer. In this manner it is possible to have higher product yields because the fin formation is achieved by fewer process steps and using fewer masks.

It will be apparent to those skilled in the art that various modifications can be made in the present invention without departing from the spirit or scope of the invention. Thus, it is intended that the present invention cover such modifications and variations provided they come within the scope of the appended claims and their equivalents.

What is claimed is:

1. A method of fabricating a fin field-effect transistor, comprising:

sequentially forming a first insulating layer and a second insulating layer on an active region of a substrate;

forming a trench in an inactive region of the substrate by using the first and second insulating layers as a mask;

forming an element isolation layer in the trench; and removing the second insulating layer; and simultaneously removing the first insulating layer and a predetermined thickness of the element isolation layer, wherein the active region of the substrate protrudes upwardly higher than the element isolation layer.

2. The method of claim 1, further comprising forming a well region in the active region of the substrate that protrudes upwardly higher than the element isolation layer.

3. The method according to claim 1, wherein forming the element isolation layer comprises:

forming a third insulating layer on the entire surface of the substrate where the trench is formed; and performing chemical-mechanical polishing to the third insulating layer until the second insulating layer is exposed.

4. The method according to claim 1, further comprising:

implanting ions into the active region to form a well region;

forming a gate electrode in the active region; and implanting ions on both sides of the gate electrode to form a source/drain region.

5. The method according to claim 4, further comprising:

forming a spacer on the sidewall of the gate electrode; and forming a heavily doped junction region of the source/drain region by using the spacer as a mask.

6. The method according to claim 5, wherein the heavily doped junction region of the source/drain region extends past the top surface of the element isolation layer.

7. The method according to claim 6, wherein the heavily doped junction region of the source/drain region extend past the top surface of the element isolation layer by at least 500 angstroms.

8. The method according to claim 6, further comprising:

forming a silicide over the gate electrode; and forming a silicide over the source/drain region.

9. The method according to claim 8, wherein the silicide over the source/drain region extends from the spacer to the element isolation layer.

10. The method of claim 1, wherein the first insulating layer is a pad oxide layer.

11. The method of claim 1, wherein the second insulating layer is a pad nitride layer.

12. The method of claim 1, wherein a rinsing process using a sequence of solutions is employed after the formation of the element isolation layer.

13. The method of claim 12, wherein the sequence of solutions comprises $H_2SO_4$, NH4, OH, and HF.

14. The method of claim 12, wherein the sequence of solutions comprises $H_2SO_4$, $H_2O_2$, $NH_4OH$, HF, and BOE.

* * * * *